United States Patent
Lai et al.

(10) Patent No.: US 10,122,384 B2
(45) Date of Patent: Nov. 6, 2018

(54) LOGICAL INTERLEAVER

(71) Applicant: ARM Limited, Cambridge (GB)

(72) Inventors: Liangzhen Lai, Sunnyvale, CA (US);
Vikas Chandra, Fremont, CA (US);
Gary Dale Carpenter, Austin, TX (US)

(73) Assignee: ARM Limited, Cambridge (GB)

( * ) Notice: Subject to any disclaimer, the term of this patent is extended or adjusted under 35 U.S.C. 154(b) by 23 days.

(21) Appl. No.: 15/157,814

(22) Filed: May 18, 2016

(65) Prior Publication Data

US 2017/0338836 A1 Nov. 23, 2017

(51) Int. Cl.
*G11C 29/00* (2006.01)
*H03M 13/29* (2006.01)
*H03M 13/27* (2006.01)

(52) U.S. Cl.
CPC ... *H03M 13/2906* (2013.01); *H03M 13/2792* (2013.01)

(58) Field of Classification Search
None
See application file for complete search history.

(56) References Cited

U.S. PATENT DOCUMENTS

| | | | | |
|---|---|---|---|---|
| 6,014,411 A | * | 1/2000 | Wang | H04L 1/0068 375/259 |
| 6,047,398 A | * | 4/2000 | Okayama | H04N 5/945 360/73.11 |
| 6,195,781 B1 | * | 2/2001 | Kosuge | H03M 13/1515 714/784 |
| 9,014,496 B2 | * | 4/2015 | Nystad | H04N 19/197 382/166 |
| 2004/0003337 A1 | * | 1/2004 | Cypher | G11C 29/42 714/763 |
| 2005/0204267 A1 | * | 9/2005 | Nakagawa | G11B 20/1258 714/770 |
| 2008/0168332 A1 | * | 7/2008 | Palanki | H04L 1/0007 714/776 |
| 2016/0266973 A1 | * | 9/2016 | Abe | G06F 11/1068 |
| 2016/0277037 A1 | * | 9/2016 | Kajihara | H03M 13/2792 |

* cited by examiner

*Primary Examiner* — Daniel McMahon
(74) *Attorney, Agent, or Firm* — Pramudji Law Group PLLC; Ari Pramudji

(57) ABSTRACT

Various implementations described herein are directed to a memory device. The memory device includes a first interleaving circuit that receives data words and generates a first error correction code based on the received data words. The memory device includes a second interleaving circuit that receives the data words and generates a second error correction code based on the received data words as a complement to the first error correction code. The second interleaving circuit interleaves data bits from multiple different data words and stores modified data words based on the multiple different data words.

18 Claims, 10 Drawing Sheets

With Physical Interleaving

Without Physical Interleaving

400B

Read w0

Read w8

Interleave Data

Obtain New Interleaved Words

Write New w0

Write New w8

LOGICAL INTERLEAVER

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

FIGS. 1A-1B show block diagrams of conventional circuitry without physical interleaving 100A and with physical interleaving 100B with size 2, such as, e.g., having 2 multiplexers (i.e., MUX2). As shown, neighboring bits from a same word (e.g., w0b0 and w0b1) are placed twice (2×) the distance away as compared to non-interleaved bits. In this instance, the interleaved bits may be more resistant to errors. Generally, interleaving is used in digital communication and storage systems to improve the performance of error correcting codes (ECC), which have bounded detection and correction capabilities (e.g., of up to X number of data bits) for each data word. For instance, SECDED (Single-Error-Correction-Double-Error-Detection) ECC may correct a 1-bit error and detect a 2-bit error. Sometimes, if a multi-cell upset (MCU) causes a 2-bit error in a data word, SECDED ECC may detect the error, but SECDED ECC may not be able to correct the error.

As such, physical interleaving (i.e., multiplexing multiple bit lines) may be used for memory with ECC to handle MCU. Physical interleaving may be achieved by grouping the same bit from multiple words to share the same MUX, so that neighboring bits from the same word are physically distant. For instance, as shown in FIGS. 1A-1B, physical interleaving may use a 2-input MUX (MUX2), and in this instance, w0b0 and w0b1 are thus placed further away (i.e., more physically distant) from each other, thereby reducing the probability that both bits are affected by MCU. Along with MUX2, the circuitry may also include sense amplifier circuitry (SA) to perform known functions.

Further, in some instances, both the probability and the number of bits in MCU may increase with use of lower supply voltage. As such, use of lower supply voltage may call for even larger physical interleaving sizes, especially in support of runtime low-voltage operations, such as, e.g., data retention mode. Unfortunately, in some instances, a large amount of physical interleaving may cause an imbalance in footprint aspect ratio, which may affect memory power, performance, and area (PPA). Generally, in various scenarios, different physical interleaving options (e.g., different MUX options) may result in different memory aspect ratios and may have significant impact on area, read/write power, and some effects on delay and standby power.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to using logical interleaving to protect memory devices and components against data errors. For instance, various implementations described herein refer to using logical interleaving as complementary to physical interleaving. Some memory devices and/or components, such as, static random access memory (SRAM), dynamic random access memory (DRAM), etc., may be designed, configured, and/or integrated with enough physical interleaving for normal voltage operation. However, in some implementations, additional circuitry may be used to achieve logical interleaving for low-voltage, retention modes of operation, which may provide more protection for multi-cell upset (MCU).

Various implementations of logical interleaving circuitry and operations will now be described in greater detail herein with reference to FIGS. 2-6.

Figures 1A, 1B:
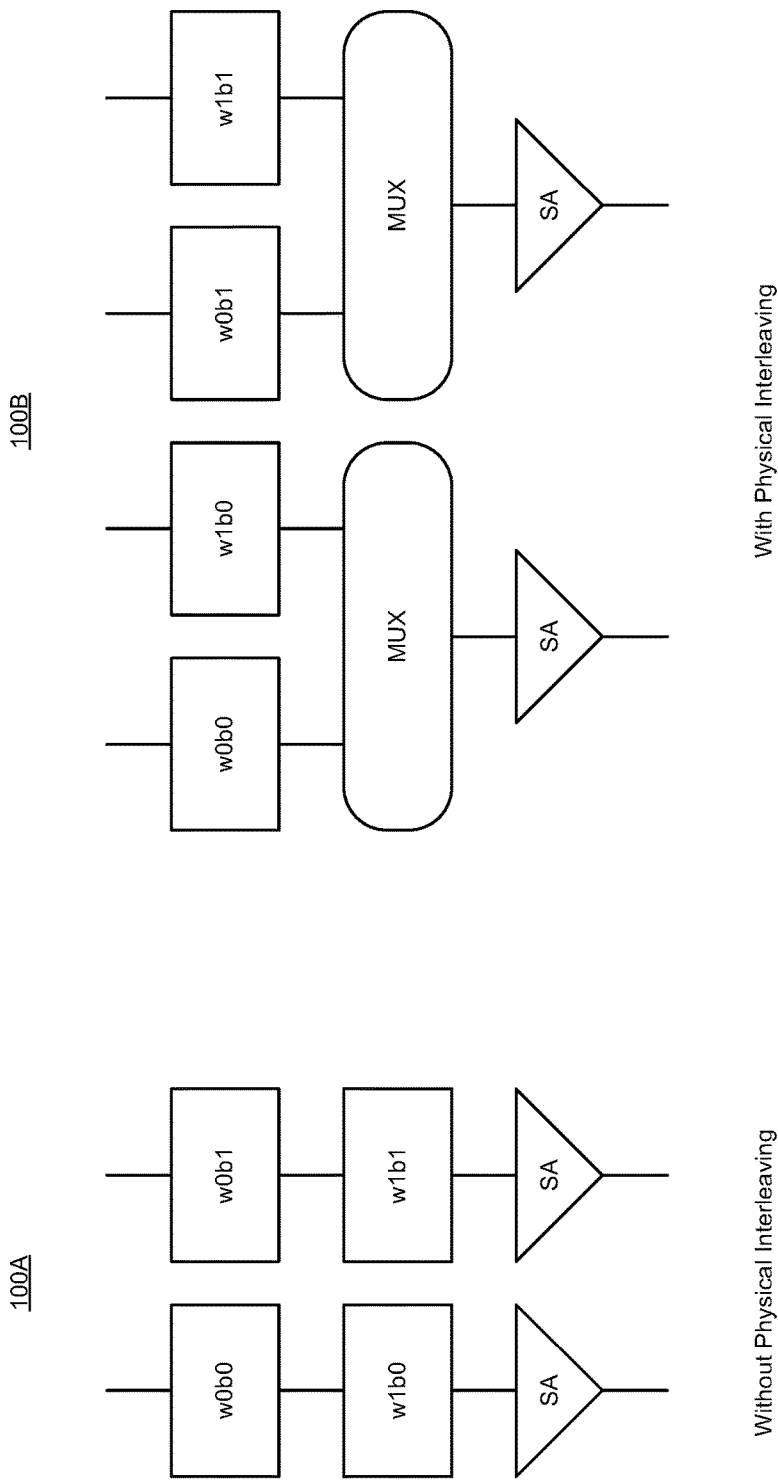
FIGS. 1A-1B illustrate conventional interleaver circuitry as known in the art.
Figure 2:
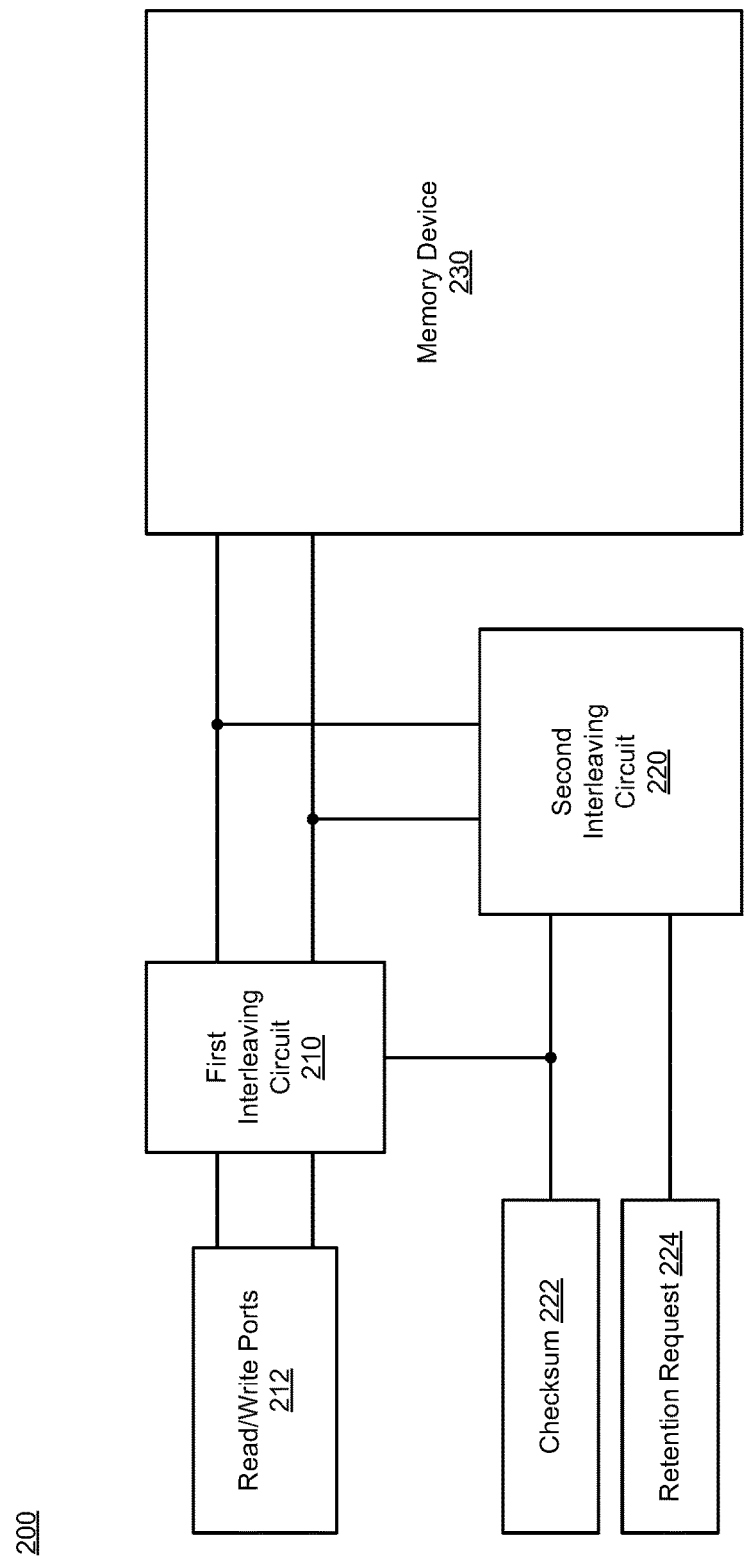
FIG. 2 illustrates a diagram of interleaver circuitry in accordance with various implementations described herein.

FIG. 2 illustrates a block diagram of interleaver circuitry 200 in accordance with various implementations described herein.

In reference to FIG. 2, a memory device 230 (e.g., SRAM, DRAM, etc.) may implement error correction capability with use of multiple interleaving circuits, such as, e.g., a first interleaving circuit 210 and a second interleaving circuit 220. As described in greater detail herein, the first interleaving circuit 210 may be configured to provide physical interleaving functions and/or operations, and the second interleaving circuit 220 may be configured to provide logical interleaving functions and/or operations.

The first interleaving circuit 210 may be configured to receive data words via read/write ports 212 and generate a first error correction code based on the received data words. As such, the first interleaving circuit 210 (or first interleaver) may be coupled to the read and write ports 212, and the first interleaving circuit 210 may be configured to receive the data words from one or more of the read and write ports 212. In some cases, each of the data bits may include a single unit of data (e.g., logical 0 or 1), and each of the data words may include a plurality of data bits (e.g., 4-bit data word). In some cases, the data words may be referred to as binary coded words. Further, in some cases, the first interleaving circuit 210 may implement physical interleaving with error correction coding (ECC). Therefore, the first interleaving circuit 210 may be implemented as an ECC circuit (or block) that is configured to generate the first error correction code.

The second interleaving circuit 220 may be configured to receive the data words and generate a second error correction code based on the received data words as a complement to the first error correction code. As shown, the second interleaving circuit 220 (or second interleaver) may be coupled to the first interleaving circuit 210, and in some cases, the second interleaving circuit 220 may be configured to receive the data words from the first interleaving circuit 210. Further, the second interleaving circuit 220 may be configured to implement logical interleaving as further described herein. Thus, in some cases, the second interleaving circuit 220 may be configured to interleave data bits from multiple different data words and store modified data words based on the multiple different data words. In this instance, the data words may refer to a plurality of data words (or binary coded words) that include the multiple different data words, and further, each of the plurality of data words may include a plurality of data bits.

As shown in FIG. 2, the interleaver circuitry 200 may include a checksum generating circuit 222 that generates a check-sum (e.g., hash data or hash code) from at least a portion of the received data words. In some cases, the first and second interleaving circuits 210, 220 may be coupled to the checksum generating circuit 222. As such, the first and second interleaving circuits 210, 220 may receive a checksum (e.g., hash data or hash code) from the checksum generating circuit 222 so as to assist with detecting various errors that may be introduced to the received data words during transmission and/or storage.

In some implementations, the interleaver circuitry 200 may be referred to as a memory circuit or some portion thereof. In various instances, the memory circuit may be referred to as memory, a memory component, or a memory device, and the memory circuit may include any type of memory, such as, e.g., any type of and/or combination of volatile memory and/or non-volatile memory. For instance, the memory circuit may be implemented as an SRAM circuit having the memory device 230, such as, e.g., an SRAM device. In another instance, the memory circuit may be implemented as a DRAM circuit having the memory device 230, such as, e.g., a DRAM device. Thus, in some cases, the memory circuit or the memory device 230 may be configured to store one or more of the first error correction code, the second error correction code, and the modified data words. As shown, the first interleaving circuit 210 may be coupled to the memory device 230, and the first interleaving circuit 210 may be configured to store the first error correction code and/or the received data words in the memory device 230. I.e., the memory device 230 may be coupled to the first interleaving circuit 210 to receive and store the first error correction code and/or the received data words. Further, as shown, the second interleaving circuit 220 may be coupled to the memory device 230, and the second interleaving circuit 230 may be configured to store the second error correction code and/or the modified data words in the memory device 230. I.e., the memory device 230 may be coupled to the second interleaving circuit 220 to receive and store the second error correction code and/or the modified data words.

In reference to FIG. 2, the second interleaving circuit 220 may be referred to as a logical interleaving engine. As shown, the second interleaving circuit 220 (or engine) may be coupled to the memory device 230 (e.g., SRAM). Further, as shown, the second interleaving circuit 220 (or engine) may be coupled to the first interleaving circuit 210 (or ECC engine) and the checksum generating circuit 222 (or checksum generator). In some cases, based on receiving a retention request 224, the second interleaving circuit 220 (or engine) may perform logical interleaving operations on the received data words. Some examples of these logical interleaving operations are shown as pseudo code in reference to Table 1 below. The basic idea refers to storing newly generated or modified data words from multiple (e.g., at least two) different data words from the received data words.

TABLE 1

Figure 3:
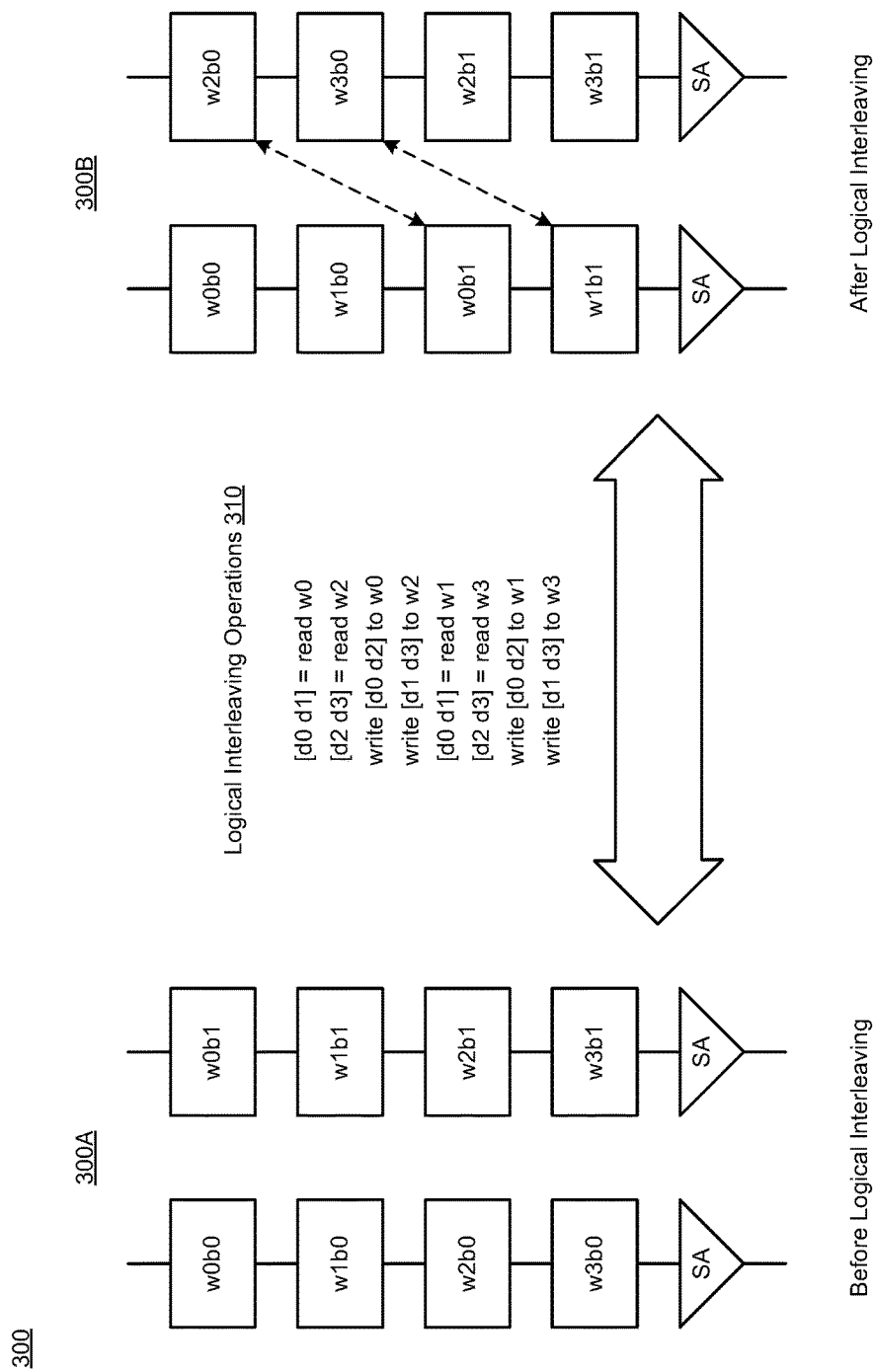
FIG. 3 illustrates a diagram of logical interleaving operations in accordance with various implementations described herein.

For all Address $[0, a_{m-1}, a_{m-2}, \ldots, a_1, a_0]$
   # read bits from two far-away words, i.e., with different MSBs in address
   W1 $[w^1_n, w^1_{n-1}, \ldots, w^1_1, w^1_0]$ = read $[0, a_{m-1}, a_{m-2}, \ldots, a_1, a_0]$
   W2 $[w^2_n, w^2_{n-1}, \ldots, w^2_1, w^2_0]$ = read $[1, a_{m-1}, a_{m-2}, \ldots, a_1, a_0]$
   # interleave the bits from the two words and write back
   Write $[w^1_n, w^2_{n-1}, w^1_{n-2}, w^2_{n-3}, \ldots w^1_1, w^2_0]$ to $[0, a_{m-1}, a_{m-2}, \ldots, a_1, a_0]$
   Write $[w^2_n, w^1_{n-1}, w^2_{n-2}, w^1_{n-3}, \ldots w^2_1, w^1_0]$ to $[1, a_{m-1}, a_{m-2}, \ldots, a_1, a_0]$
End FIG. 3 illustrates a schematic diagram of logical interleaving operations 300 in accordance with various implementations described herein.

In reference to FIG. 3, a first memory layout 300A is shown before performing logical interleaving, and a second memory layout 300B is shown after performing logical interleaving. In various instances, the second interleaving circuit 220 may be configured to interleave data bits from multiple different data words by switching (or, in some cases, by shifting placement of) one or more data bit values of a first data word with one or more data bit values of a second data word that is different than the first data word. In these instances, the second interleaving circuit 220 may perform logical interleaving operations 310 on the received data words. Various examples of logical interleaving operations 310 that may be performed by the second interleaving circuit 220 are shown as pseudo code in reference to Table 2 below.

TABLE 2

[d0 d1] = read w0
[d2 d3] = read w2
write [d0 d2] to w0
write [d1 d3] to w2
[d0 d1] = read w1
[d2 d3] = read w3
write [d0 d2] to w1
write [d1 d3] to w3

FIGS. 4A-4E illustrate various diagrams of interleaving operation examples in accordance with various implementations described herein.

Figure 4A:
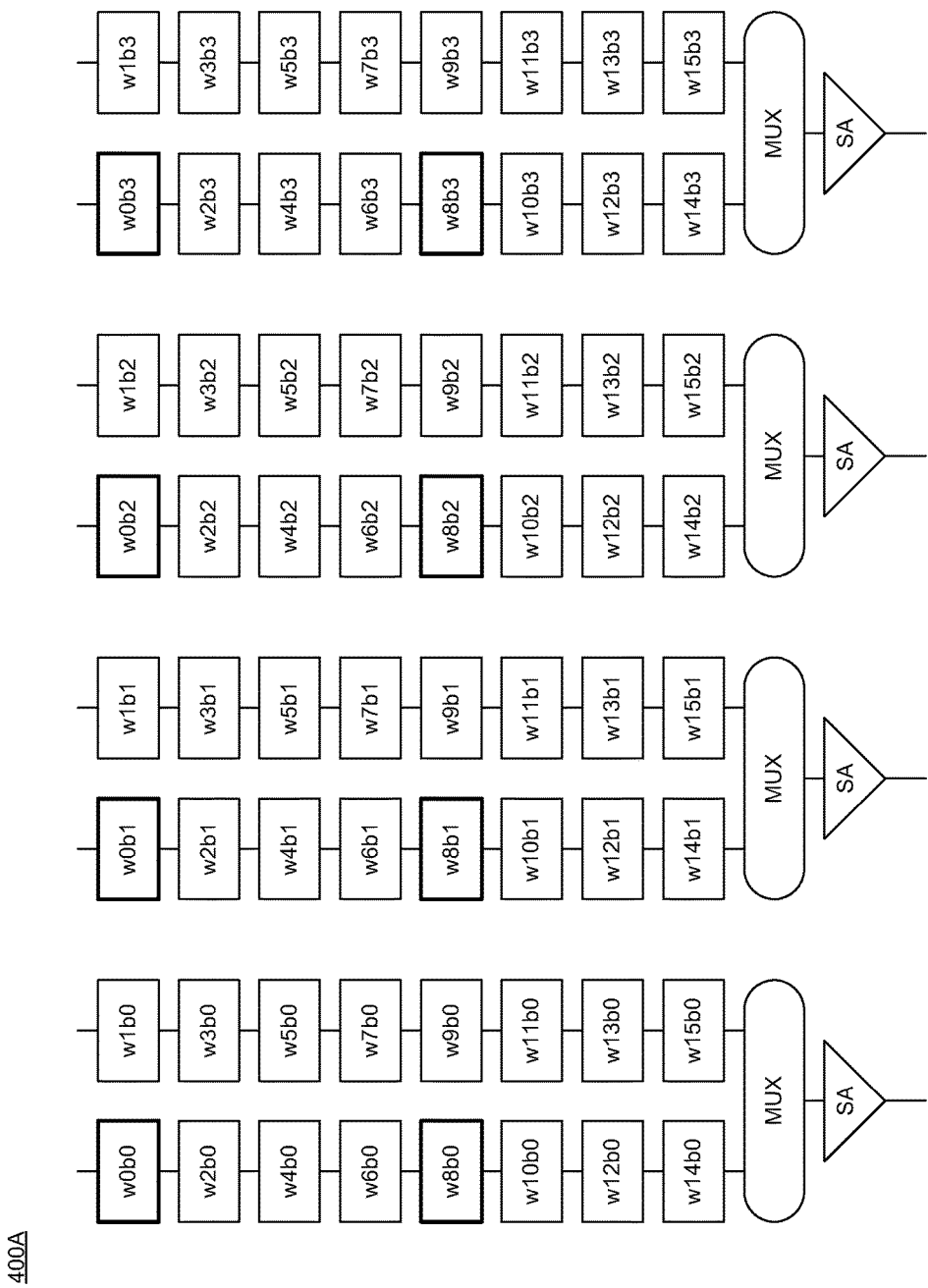
FIGS. 4A-4E illustrate various diagrams of interleaving operation examples in accordance with various implementations described herein.

In some implementations, logical interleaving may be performed independent of physical interleaving, and in some other implementations, logical interleaving may be combined with physical interleaving. These ideas are illustrated in the examples shown in FIGS. 4A-4E. For instance, a layout for memory bits with physical interleaving of 2 (i.e., MUX2) is shown in FIG. 4A. After the logical interleaving operation shown in FIG. 4B, another memory bit layout may be obtained as shown in FIG. 4C. Further, another example of a logical interleaving operation is shown in FIG. 4D, wherein another memory bit layout after logical interleaving is shown in FIG. 4E.

FIG. 4A illustrates a diagram 400A of a memory layout 400A with physical interleaving and before logical interleaving. This example may perform logical interleaving for word 0 (w0) and word 8 (w8), as shown highlighted with a bolded line. With physical interleaving only, neighboring bits from a same word have distance of 2.

Figure 4B:
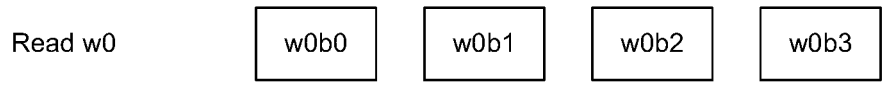
Figure 4B:
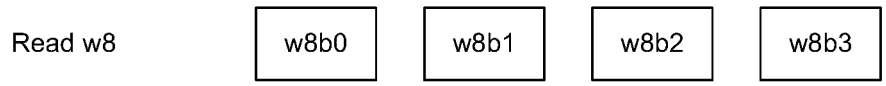
Figure 4B:
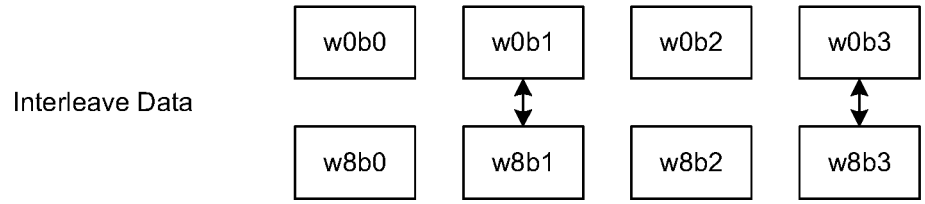
Figure 4B:
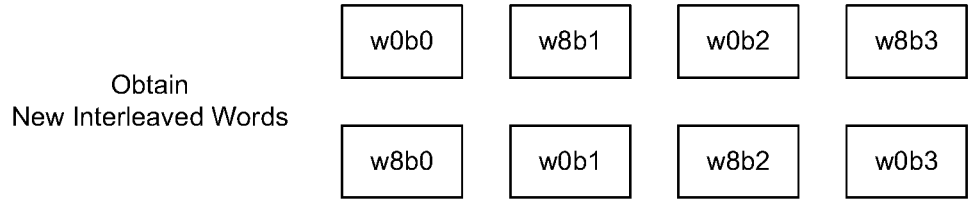
Figure 4B:
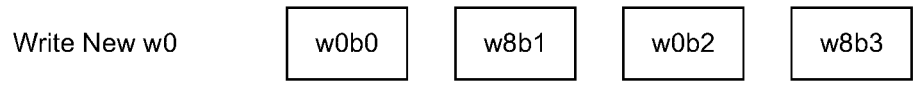
Figure 4B:
Figure 4C:
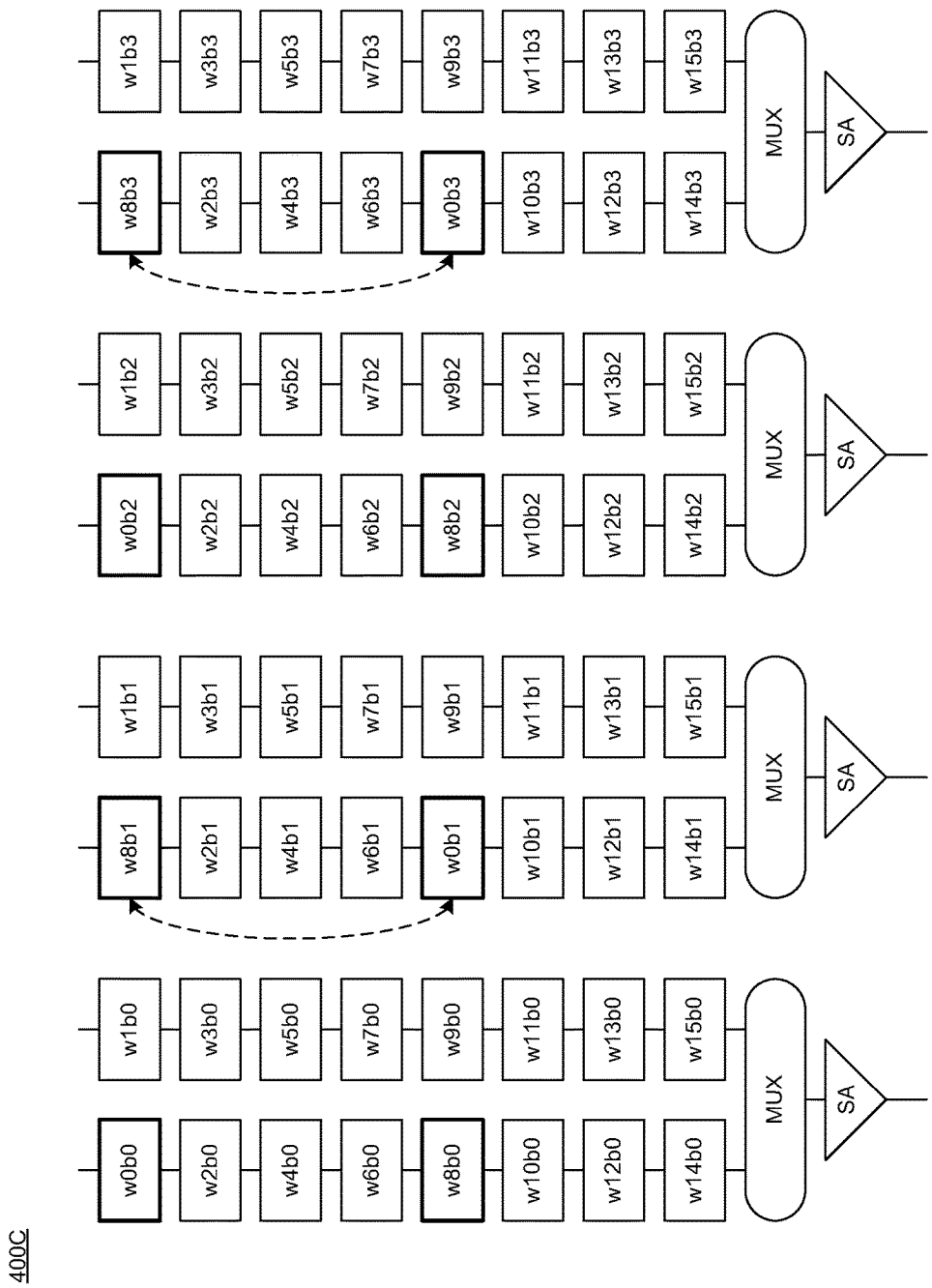
Figure 4D:
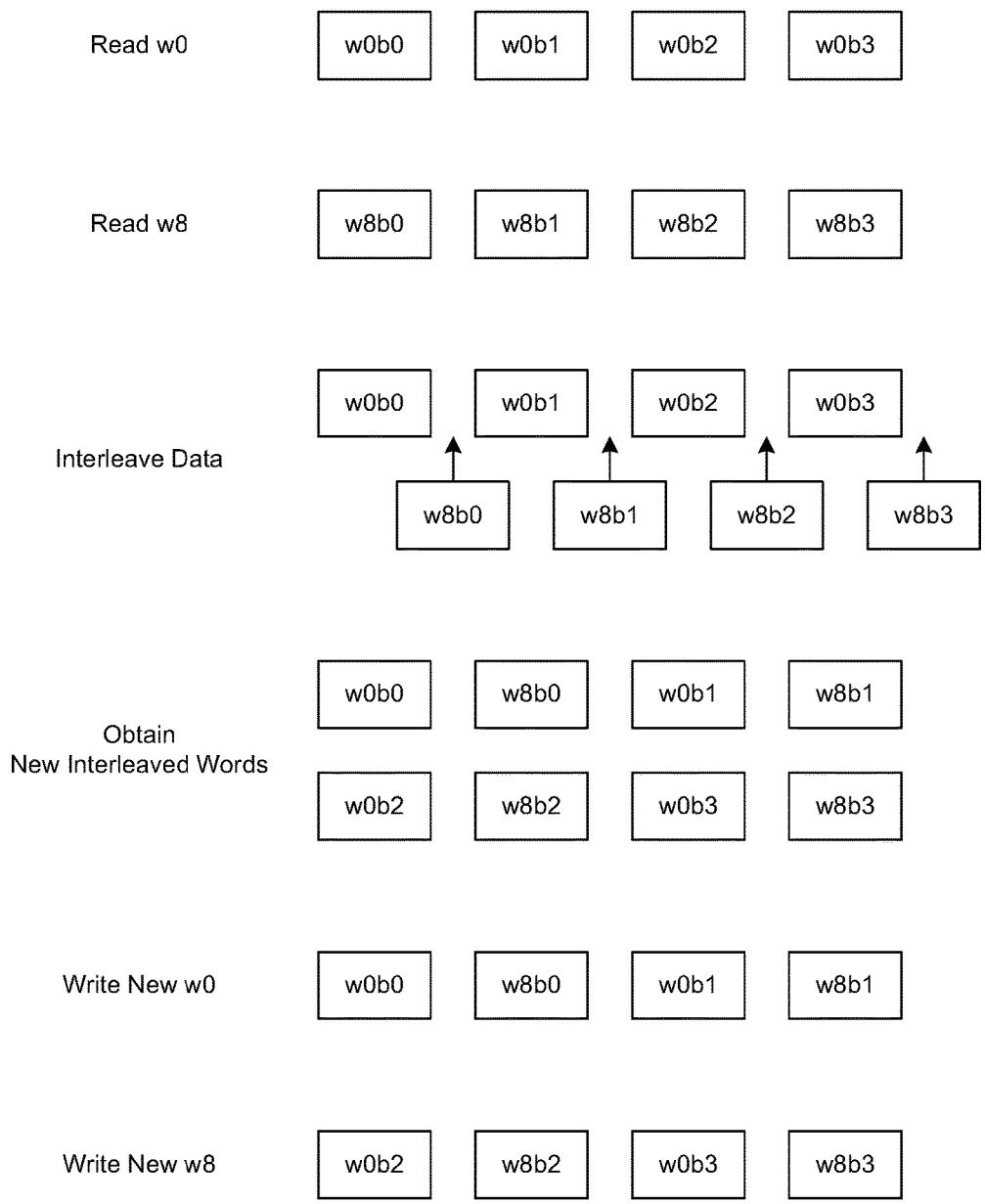
Figure 4E:
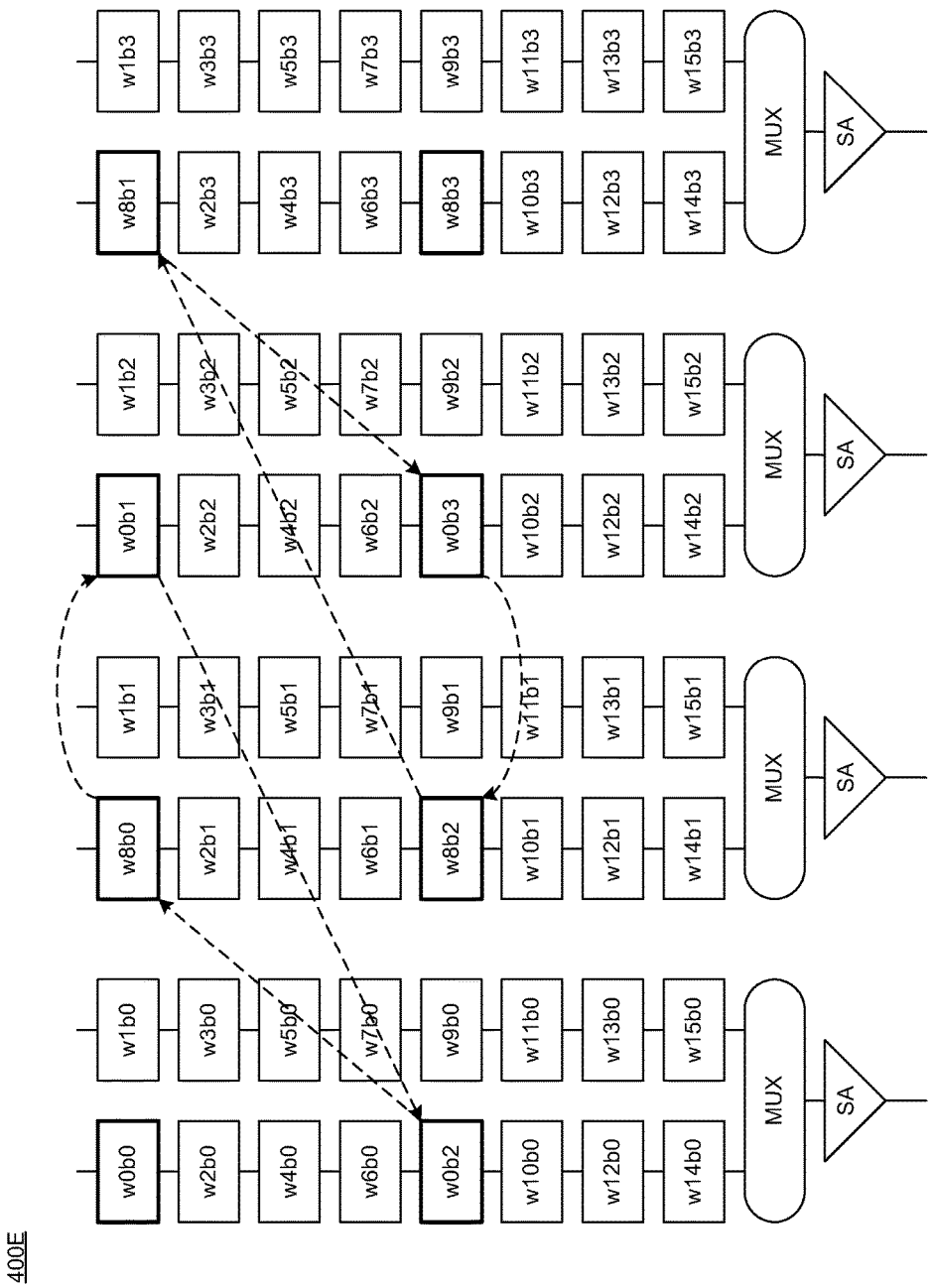

FIG. 4B illustrates a diagram 400B of an interleaving operation performed for word 0 (w0) and word 8 (w8). This same operation may be repeated with other data words (e.g., w1 and w9; w2 and w10). This interleaving operation refers to the pseudo code for the interleaving operation shown in Table 1 above.

FIG. 4C illustrates a diagram 400C of another memory layout after performing the logical interleaving operations in FIG. 4B. In some implementations, the distance between two neighboring bits from the same data word may increase, making interleaved words more robust against multi-cell upset (MCU).

In these examples shown in FIGS. 4B-4C, the second interleaving circuit 220 may be configured to interleave data bits from multiple different data words by switching one or more data bit values of a first data word (e.g., w0) with one or more data bit values of a second data word (e.g., w8) that is different than the first data word (e.g., w0). Further, in some instances, the second interleaving circuit 220 may be configured to interleave data bits from multiple different data words by switching one or more data bit values of a first set of data words with one or more data bit values of a second set of data words that are different than the first set of data words.

FIG. 4D illustrates a diagram 400D of another interleaving operation that may be performed for word 0 (w0) and word 8 (w8). The same operation may be repeated with other data words (e.g., w1 and w9; w2 and w10). This interleaving operation refers to the interleaving operation shown in Table 2 above.

FIG. 4E illustrates a diagram 400E of another memory layout after performing the logical interleaving operations in FIG. 4D. In some implementations, the distance between two neighboring bits from the same data word may increase, making interleaved words more robust against multi-cell upset (MCU).

In these examples shown in FIGS. 4D-4E, the second interleaving circuit 220 may be configured to interleave data bits from multiple different data words by shifting placement of one or more data bit values of a first data word (e.g., w0) with one or more data bit values of a second data word (e.g., w8) that is different than the first data word (e.g., w0). Further, in some instances, the second interleaving circuit 220 may be configured to interleave data bits from multiple different data words by shifting placement of one or more data bit values of a first set of data words with one or more data bit values of a second set of data words that are different than the first set of data words.

In some implementations, in reference to FIG. 2, the memory device 230 may include SRAM, which may be configured to operate in hybrid-mode for normal operation and retention mode (e.g., sleep mode). In normal mode, the second interleaving circuit 220 (or engine) may be turned OFF (or deactivated), and the SRAM may read and write as usual. Further, in normal mode, a normal supply voltage may be used, and multi-cell upset (MCU) may be protected against with physical interleaving only.

Upon receiving one or more data retention requests 224, possibly with other events, such as, e.g., core power gating, the second interleaving circuit 220 (or engine) may be turned ON (or activated) and perform the logical interleaving operations before clamping the normal supply voltage to a data retention voltage (DRV). For instance, in this retention mode, stored data may be protected against MCU with both physical and logical interleaving. Upon receiving a wake-up signal, the second interleaving circuit 220 (or engine) may be configured to restore the stored data, so that the SRAM may read or write in the normal mode. In some cases, during various interleaving operations, an error correction code (ECC) signature may be verified on-the-fly by the first interleaving circuit 210 (e.g., ECC circuit or block) for both entering and exiting the retention mode. As shown in FIG. 2, the checksum generating circuit 222 may be configured to generate a check-sum check-sum (e.g., hash data or hash code), which may also be generated during the interleaving operations to better protect the data against multi-bit errors.

Figure 5:
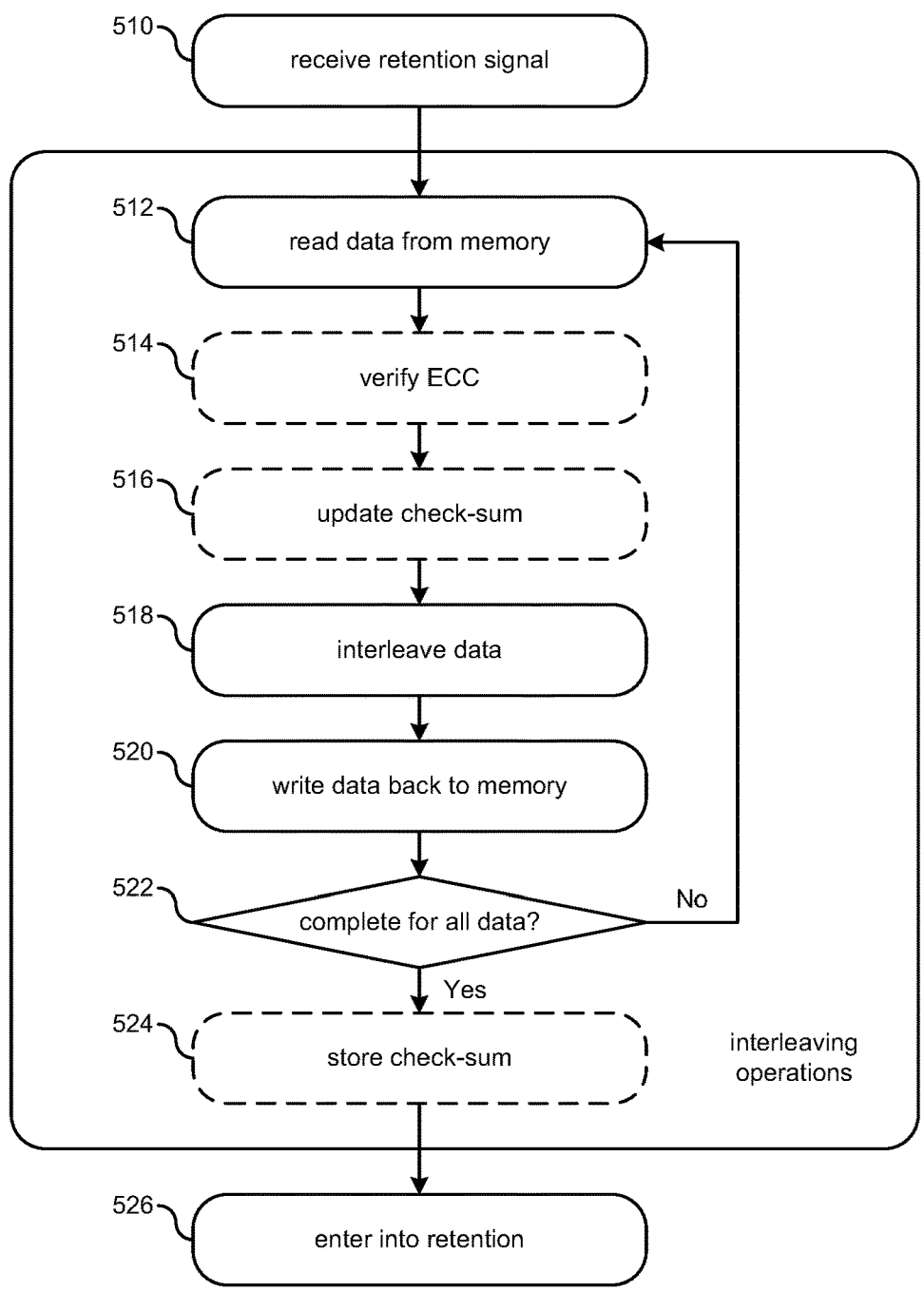
FIG. 5 illustrates a method for performing interleaving process operations in accordance with various implementations described herein.

Moreover, an example process flow of interleaving operations when entering retention mode is shown and described herein in reference to FIG. 5. For instance, upon receiving one or more retention signals, the second interleaving circuit 220 (or engine) may be configured to perform interleaving operations over the data words stored in the memory device 230, such as, e.g., SRAM. Further, an example process flow of de-interleaving operations are also shown and described herein in reference to FIG. 6.

FIG. 5 illustrates a method 500 for performing interleaving process operations in accordance with various implementations described herein.

It should be understood that even though method 500 may indicate a particular order of execution of operations, in some instances, various certain portions of the operations may be executed in a different order, and on different systems. In some other instances, additional operations or steps may be added to and/or omitted from method 500. The method 500 may be implemented in hardware and/or software. If implemented in hardware, the method 500 may be implemented with various circuit components, such as described herein above in reference to FIGS. 2-4E. If implemented in software, the method 500 may be implemented as a program or software instruction process that may be configured to perform interleaving process operations as described herein. Further, if implemented in software, instructions related to implementing the method 500 may be stored in memory and/or a database. For instance, a computer or various other computing devices having a processor and memory may be configured to perform method 500.

In reference to FIG. 5, method 500 may be configured to perform interleaving operations. In some cases, FIG. 5 illustrates a process flow of interleaving operations when entering retention mode. The dashed blocks are optional. For instance, the "verify ECC" block is optional and may be similar to memory scrubbing.

At block 510, method 500 may receive a retention signal. At block 512, method 500 may read data from memory. At block 514, method 500 may verify an error correction code (ECC). At block 516, method 500 may update a check-sum. At block 518, method 500 may interleave data. At block 520, method 500 may write data back to memory. At decision block 522, method 500 may determine whether interleaving has been performed or completed for some or all data. If no, then method 500 returns to block 512. If yes, method 500 proceeds to block 524. At block 524, method 500 may store the check-sum. At block 526, method 500 may enter into retention mode.

In some implementations, method 500 of FIG. 5 may be modified to perform one or more various tasks for reducing memory storage errors. For instance, method 500 may be configured to receive data words from one or more read and write ports. Further, method 500 may be configured to generate a first error correction code based on the received data words. Further, method 500 may be configured to generate a second error correction code based on the received data words as a complement to the first error correction code by interleaving data bits from multiple different data words and storing modified data words based on the multiple different data words.

Figure 6:
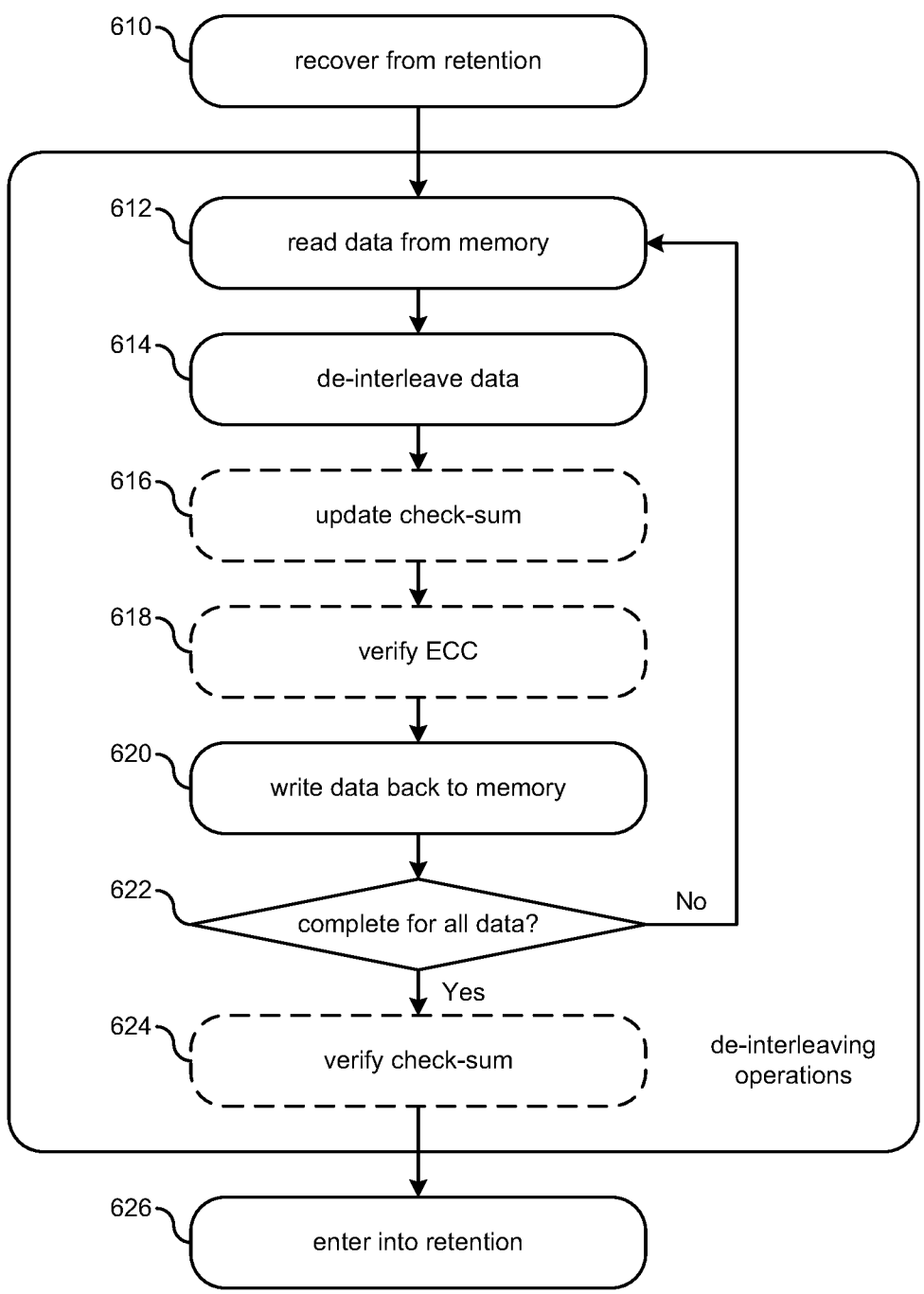
FIG. 6 illustrates a method for performing de-interleaving process operations in accordance with various implementations described herein.

FIG. 6 illustrates a method 600 for performing de-interleaving process operations in accordance with various implementations described herein.

It should be understood that even though method 600 may indicate a particular order of execution of operations, in some instances, various certain portions of the operations may be executed in a different order, and on different systems. In some other instances, additional operations or steps may be added to and/or omitted from method 600. The method 600 may be implemented in hardware and/or software. If implemented in hardware, the method 600 may be implemented with various circuit components, such as described herein above in reference to FIGS. 2-4E. If implemented in software, the method 600 may be implemented as a program or software instruction process that may be configured to perform de-interleaving process operations as described herein. Further, if implemented in software, instructions related to implementing the method 600 may be stored in memory and/or a database. For instance, a computer or various other computing devices having a processor and memory may be configured to perform method 600.

In reference to FIG. 6, method 600 is configured to perform de-interleaving operations. For instance, FIG. 6 illustrates a process flow of de-interleaving operations when entering retention mode. The dashed blocks may be optional. In some cases, the "verify ECC" block is optional and may be similar to memory scrubbing.

At block 610, method 600 may recover from retention. At block 612, method 600 may read data from memory. At block 614, method 600 may de-interleave data. At block 616, method 600 may update a check-sum. At block 618, method 600 may verify an error correction code (ECC). At block 620, method 600 may write data back to memory. At decision block 622, method 600 may determine whether interleaving has been performed or completed for some or all data. If no, then method 600 returns to block 612. If yes, method 600 proceeds to block 624. At block 624, method 600 may verify the check-sum. At block 626, method 600 may enter into retention mode.

In some implementations, as shown in FIG. 5-6, the interleaving operations and de-interleaving operations may read through data in memory. Further, in some cases, a check-sum feature may be integrated. Thus, in reference to FIG. 5, a check-sum may be generated when reading data during interleaving operations before retention. Further, in reference to FIG. 6, after recovering from retention, the check-sum may be generated again and compared with the stored check-sum generated in FIG. 5 before entering into retention. Hence, in some implementations, this additional check-sum feature may offer additional error protection along with ECC for 3-bit errors or more than 3-bit errors.

In some implementations, logical interleaving and de-interleaving may refer to use of an algorithm that is configured to perform such functional operations. The logical interleaving and de-interleaving algorithms may be implemented in and/or integrated with hardware and/or software. Further, the logical interleaving and de-interleaving algorithms may be performed on any type of memory device and/or component, such as, e.g., SRAM, DRAM, or any other type of similar memory device and/or component.

In some implementations, the interleaving circuitry may be integrated with other circuit operations and/or functions, such as, e.g., built-in self-test (BIST), to assist with reducing static overhead. In some cases, a main overhead for logic interleaving may be produced in two parts, such as, e.g., energy overhead and latency overhead for entering and/or exiting retention mode. In some cases, latency overhead may depend on memory size, such as, e.g., SRAM size. In other cases, latency overhead may depend on various other types of latencies, such as, e.g., voltage level change by a regulator and/or core power gating from hardware and software. Thus, energy overhead for logical interleaving may depend on the SRAM size and how frequent SRAM enters retention.

Described herein are various implementations of a memory device. The memory device may include a first interleaving circuit that receives data words and generates a first error correction code based on the received data words. The memory device may include a second interleaving circuit that receives the data words and generates a second error correction code based on the received data words as a complement to the first error correction code. The second interleaving circuit may interleave data bits from multiple different data words and store modified data words based on the multiple different data words.

Described herein are various implementations of a memory circuit. The memory circuit may include a first interleaver that receives binary coded words and generates a first error correction code based on the received binary coded words. The memory circuit may include a second interleaver that receives the binary coded words and generates a second error correction code based on the received binary coded words as a complement to the first error correction code. The second interleaver may store modified binary coded words based on interleaved data bits from multiple different binary coded words.

Described herein are various implementations of a method for reducing memory storage errors. The method may include receiving data words from one or more read and write ports. The method may include generating a first error correction code based on the received data words. The method may include generating a second error correction code based on the received data words as a complement to the first error correction code by interleaving data bits from multiple different data words and storing modified data words based on the multiple different data words.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A memory device, comprising:
   a first interleaving circuit coupled to read and write ports, wherein the first interleaving circuit:
      receives data words from one or more of the read and write ports,
      physically interleaves the received data words, and
      generates a first error correction code based on the physical interleaving of the received data words; and
   a second interleaving circuit that is separate from and coupled to the first interleaving circuit, wherein the second interleaving circuit:
      receives the data words from the first interleaving circuit,
      logically interleaves the data words received from the first interleaving circuit, and
      generates a second error correction code based on the logical interleaving of the data words received from the first interleaving circuit as a complement to the first error correction code by interleaving data bits from multiple different data words and storing modified data words based on the multiple different data words,
   wherein the physical interleaving of the first interleaving circuit and the logical interleaving of the second interleaving circuit protect data stored in the memory device against multi-cell upset.

2. The device of claim 1, wherein each of the data bits comprises a single unit of data, and wherein each of the multiple different data words comprises a plurality of data bits.

3. The device of claim 1, wherein the data words include the multiple different data words, and wherein each of the multiple different data words comprises a plurality of data bits.

4. The device of claim 1, wherein the first interleaving circuit comprises an error correction code (ECC) circuit that generates the first error correction code.

5. The device of claim 1, further comprising a checksum generating circuit that generates hash data from at least a portion of the received data words, wherein the first interleaving circuit and the second interleaving circuit are coupled to the checksum generating circuit, and wherein the first interleaving circuit and the second interleaving circuit receive the hash data from the checksum generating circuit so as to detect errors introduced to the received data words during transmission.

6. The device of claim 1, further comprising a memory circuit that stores one or more of the first error correction code, the second error correction code, and the modified data words.

7. The device of claim 6, wherein the memory circuit comprises a static random access memory (SRAM) circuit.

8. The device of claim 6, wherein the first interleaving circuit is coupled to the memory circuit, and wherein the first interleaving circuit stores the first error correction code in the memory circuit.

9. The device of claim 6, wherein the second interleaving circuit is coupled to the memory circuit, and wherein the second interleaving circuit stores the second error correction code and the modified data words in the memory circuit.

10. The device of claim 1, wherein the second interleaving circuit interleaves data bits from the multiple different data words by switching one or more data bit values of a first data word with one or more data bit values of a second data word that are different than the first data word.

11. The device of claim 1, wherein the second interleaving circuit interleaves data bits from the multiple different data words by switching one or more data bit values of a first set of data words with one or more data bit values of a second set of data words that are different than the first set of data words.

12. The device of claim 1, wherein the second interleaving circuit interleaves data bits from the multiple different data words by shifting placement of one or more data bit values of a first data word with one or more data bit values of a second data word that are different than the first data word.

13. The device of claim 1, wherein the second interleaving circuit interleaves data bits from the multiple different data words by shifting placement of one or more data bit values of a first set of data words with one or more data bit values of a second set of data words that are different than the first set of data words.

14. A memory circuit, comprising:
- a first interleaving circuit coupled to read and write ports, wherein the first interleaving circuit:
  - receives binary coded words from one or more of the read and write ports,
  - physically interleaves the received binary coded words, and
  - generates a first error correction code based on the physical interleaving of the received binary coded words; and
- a second interleaving circuit that is separate from and coupled to the first interleaving circuit, wherein the second interleaving circuit:
  - receives the binary coded words from the first interleaving circuit,
  - logically interleaves the binary coded words received from the first interleaving circuit,
  - generates a second error correction code based on the logical interleaving of the received binary coded words as a complement to the first error correction code, and
  - stores modified binary coded words based on interleaved data bits from multiple different binary coded words,
- wherein the physical interleaving of the first interleaving circuit and the logical interleaving of the second interleaving circuit protect data stored in the memory circuit against multi-cell upset.

15. The circuit of claim 14, further comprising a checksum generator that generates hash data from at least a portion of the received binary coded words, wherein the first interleaving circuit and the second interleaving circuit are coupled to the checksum generator, and wherein the first interleaving circuit and the second interleaving circuit receive the hash data from the checksum generator so as to detect errors introduced to the received binary coded words during transmission.

16. The circuit of claim 14, wherein the second interleaving circuit interleaves data bits from multiple different binary coded words by switching one or more data bit values of a first binary coded word with one or more values of a second binary coded word that are different than the first binary coded word.

17. The circuit of claim 14, wherein the second interleaving circuit interleaves data bits from multiple different binary coded words by shifting placement of one or more data bit values of a first binary coded word with one or more values of a second binary coded word that are different than the first binary coded word.

18. A method for reducing memory storage errors, the method comprising:
- receiving data words from one or more read and write ports with a first interleaver circuit that is coupled to the one or more read and write ports, the first interleaver circuit physically interleaving the received data words;
- receiving the data words from the first interleaver circuit with a second interleaver circuit that is coupled to the first interleaver circuit, the second interleaver circuit logically interleaving the data words received from the first interleaver circuit;
- generating a first error correction code with the first interleaver circuit based on the physical interleaving of the received data words;
- generating a second error correction code with the second interleaver circuit based on the logical interleaving of the received data words as a complement to the first error correction code by interleaving data bits from multiple different data words and storing modified data words based on the multiple different data words,
- wherein the second interleaver circuit is separate from the first interleaver circuit,
- wherein the physical interleaving of the first interleaver circuit and the logical interleaving of the second interleaving circuit protect stored data against multi-cell upset.

* * * * *